US012618152B2

(12) United States Patent
Groven et al.

(10) Patent No.: US 12,618,152 B2
(45) Date of Patent: May 5, 2026

(54) METHOD OF DEPOSITING A TRANSITION METAL DICHALCOGENIDE

(71) Applicants: IMEC VZW, Leuven (BE); Katholieke Universiteit Leuven, Leuven (BE)

(72) Inventors: Benjamin Groven, Kortessem (BE); Vladislav Voronenkov, Leuven (BE); Dries Vranckx, Lubbeek (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 18 days.

(21) Appl. No.: 18/483,200

(22) Filed: Oct. 9, 2023

(65) Prior Publication Data

US 2024/0124975 A1 Apr. 18, 2024

(30) Foreign Application Priority Data

Oct. 12, 2022 (EP) ..................................... 22201093

(51) Int. Cl.
*C23C 16/455* (2006.01)
*C23C 16/30* (2006.01)
(52) U.S. Cl.
CPC ...... *C23C 16/45514* (2013.01); *C23C 16/305* (2013.01)
(58) Field of Classification Search
None
See application file for complete search history.

(56) References Cited

U.S. PATENT DOCUMENTS

| | | | |
|---|---|---|---|
| 5,843,590 A | 12/1998 | Miura et al. | |
| 6,733,591 B2 | 5/2004 | Anderson | |
| 2019/0338416 A1 | 11/2019 | Kong et al. | |

FOREIGN PATENT DOCUMENTS

| | | |
|---|---|---|
| DE | 2056160 A1 | 6/1971 |
| DE | 2324127 A1 | 12/1973 |
| DE | 10 2011 002145 A1 | 10/2012 |
| DE | 10 2020 122679 A1 | 3/2022 |
| WO | WO 2018/231153 A1 | 12/2018 |

OTHER PUBLICATIONS

Zhang et al.; Considerations for Utilizing Sodium Chloride in Epitaxial Molybdenum Disulfide; Applied Materials & Interfaces; 2018, 10, 40831-40837.*
Chiappe et al.; Layer-Controlled Epitaxy of 2D Semiconductors: Bridging Nanoscale Phenomena to Wafer-Scale Uniformity; Nanotechnology; 29 (2018) 425602.*
Voronenkov et al.; Abstract of HCI-Assisted MOCVD of WS2; 241st Electrochemical Society Meeting; 2022.*

(Continued)

*Primary Examiner* — Michael P. Rodriguez
(74) *Attorney, Agent, or Firm* — Knobbe, Martens, Olson & Bear, LLP

(57) ABSTRACT

In one aspect, a method of depositing a transition metal dichalcogenide is provided. The method includes depositing a layer of the transition metal dichalcogenide on a substrate by a metalorganic chemical vapor deposition process including exposing the substrate to a mixture of reactant gases including a transition metal precursor and a chalcogen precursor. The mixture further includes a gas-phase halogen-based reactant to volatilize transition metal adatoms deposited on the substrate.

17 Claims, 6 Drawing Sheets

T=700 °C

T=800 °C

(56) References Cited

OTHER PUBLICATIONS

Kim et al.; Atomic Layer Etching Mechanism of MoS2 for Nanodevices; Applied Materials & Interfaces; 2017, 9, 11967-11976.*

Gao et al., "In Situ-Generated Volatile Precursor for CVD Growth of a Semimetallic 2D Dichalcogenide," *ACS Applied Materials & Interfaces*, vol. 10, No. 40, Sep. 2018, pp. 34401-34408.

George et al., "Controlled growth of transition metal dichalcogenide monolayers using Knudsen-type effusion cells for the precursors," *Journal of Physics: Materials*, vol. 2, No. 1, Jan. 10, 2019, 12 pages.

Kang et al., "High-mobility three-atom-thick semiconducting films with wafer-scale homogeneity," *Nature*, vol. 520, Apr. 30, 2015, pp. 656-660 and Supplementary Information in 15 pages.

Kim et al., "Suppressing Nucleation in Metal-Organic Chemical Vapor Deposition of MoS2 Monolayers by Alkali Metal Halides," *Nano Letters*, vol. 17, No. 8, Jul. 12, 2017, pp. 5056-5063.

Li et al., "Halide-Assisted Atmospheric Pressure Growth of Large WSe2 and WS2 Monolayer Crystals," Applied Materials Today, vol. 1, No. 1, Sep. 2015, pp. 60-66.

Patsha et al., "Halide chemical vapor deposition of 2D semiconducting atomically-thin crystals: From self-seeded to epitaxial growth," *Applied Materials Today*, vol. 26, 2022, 13 pages, and Supporting Information in 8 pages.

Voronenkov et al., Abstract of "HCl-Assisted MOCVD of WS2," 241st Electrochemical Society Meeting, 2022, 5 pages.

Zhang et al., "Considerations for Utilizing Sodium Chloride in Epitaxial Molybdenum Disulfide," *ACS Applied Materials & Interfaces*, vol. 10, No. 47, Nov. 2018, pp. 40831-40837.

Extended European Search Report dated Mar. 20, 2023 for EP Application No. 22201093.6 in 8 pages.

* cited by examiner

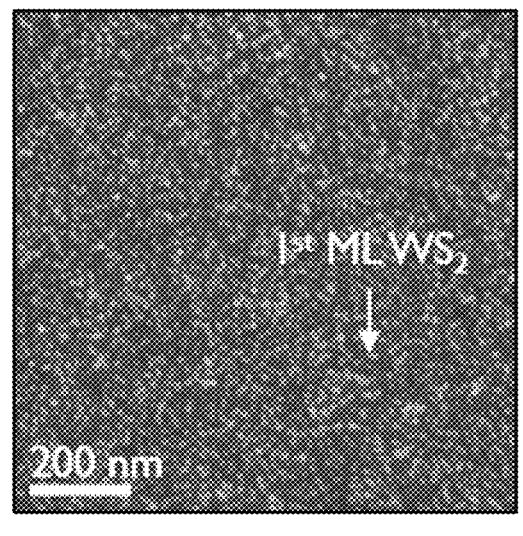
Fig. 1A  T=700 °C
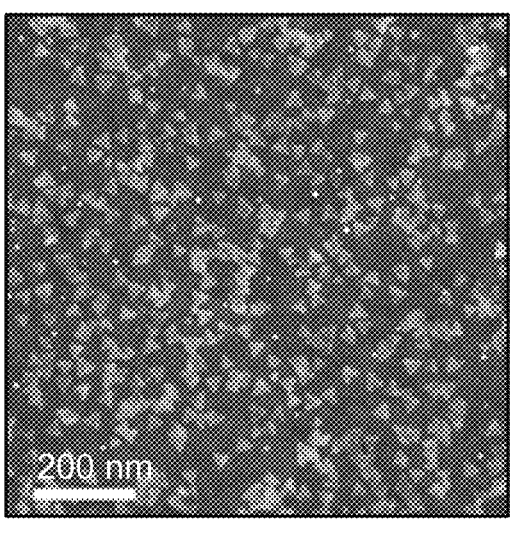
Fig. 1B  T=800 °C
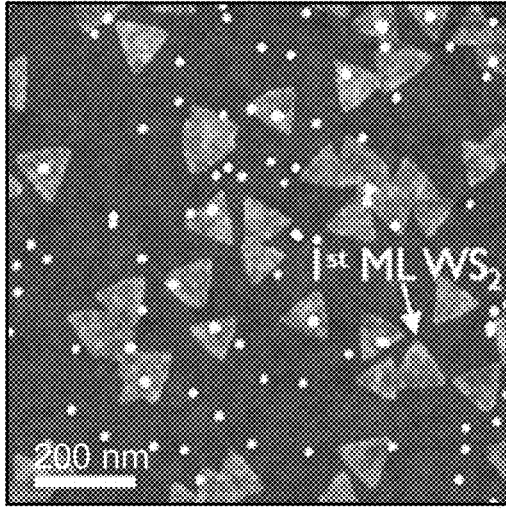
Fig. 1C  T=900 °C
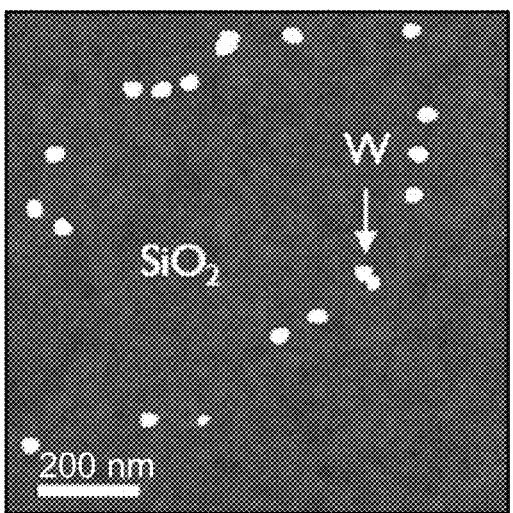
Fig. 1D  T=1000 °C 0.8% relative HCl concentration 2.0% relative HCl concentration 4.0% relative HCl concentration 6.0% relative HCl concentration

METHOD OF DEPOSITING A TRANSITION METAL DICHALCOGENIDE

CROSS-REFERENCE TO RELATED APPLICATIONS

This application claims foreign priority to European Patent Application No. EP 22201093.6, filed Oct. 12, 2022, the content of which is incorporated by reference herein in its entirety.

BACKGROUND

Technical Field

The disclosed technology relates to a method of depositing a transition metal dichalcogenide by a metalorganic chemical vapor deposition process.

Description of the Related Technology

Transition metal dichalcogenides (abbreviated $MX_2$) have appeared as an interesting channel material candidate in scaled electronic devices, for instance, for devices with sub-nanometer channel thickness and channel lengths below 10 nm. An $MX_2$ material is formed by a monolayer or a stack of monolayers, wherein each monolayer is formed by a single layer of transition metal atoms M (for example, group-IV or group-VI transition metals such as molybdenum (Mo) or tungsten (W)) sandwiched between two layers of chalcogen atoms X (for example, sulfur (S), selenium (Se), or tellurium (Te)). In current research, particular attention is given to the integration of molybdenum and tungsten disulfide ($MoS_2$, $WS_2$) in advanced complementary metal-oxide semiconductor (CMOS) and memory systems.

Realizing the theoretically predicted $MX_2$ electrical performance relies partly on the manufacturable deposition of such materials with desired control over crystallinity, structure, and material properties. The research community considers chemical vapor deposition (CVD) as the most promising deposition technique for $MX_2$ materials in view of its superior control over crystallinity, structure, and layer thickness at reduced cost and relevant wafer throughput. Historically, CVD is a widely established deposition technique in the semiconductor industry.

Yet, for the semiconductor foundries to adopt $MX_2$, one key challenge lies in identifying the CVD reaction chemistry that provides desired control over crystallinity and structure through the $MX_2$ growth behavior, while being compatible with industry standards. Such industry-compatible deposition chemistries are denoted hereafter as Fab-compatible.

Fab-compatible CVD precursors typically need to fulfill a few requirements in terms of (i) ease of use, purity, impurity, and contamination levels, in addition to (ii) more fundamental aspects related to reaction chemistry, such as metal and chalcogen precursor thermal stability, reactivity, volatility and diffusivity, and the resulting $MX_2$ deposition efficiency and deposition rate. For various instances, it is desired that the precursors exhibit sufficient volatility at room temperature to ease delivery of a carefully controlled concentration of vapor into the reaction chamber through dedicated precursor delivery systems (for example, bubbler or sublimator). Although metal-oxide based CVD has received most attention in the $MX_2$ CVD literature, metal-oxide precursors (for example, $MoO_3$) are employed in laboratory set-ups, where the poor sublimation rate of the metal-oxide precursor is overcome by placing the metal-oxide precursor inside the furnace. This, however, hinders careful control over the metal-oxide precursor dose and flow profile inside the furnace. Metal-oxide based CVD is hence not Fab-compatible.

SUMMARY OF CERTAIN INVENTIVE ASPECTS

Transition metal-organic precursors suitable for metalorganic CVD (MOCVD) such as molybdenum hexacarbonyl ($Mo(CO)_6$) do, in contrast to metal-oxide precursors, exhibit sufficient volatility at room temperature (for example, ~0.1 Torr). However, transition metal-organic precursors (hereinafter for conciseness referred to as transition metal precursor) suffer from negligible precursor desorption rate. As a result, transition metal precursor adsorption is substantially irreversible. Consequently, adsorbed surface species (for example, transition metal adatoms) are incorporated in growing $MX_2$ crystals predominantly or exclusively through surface diffusion. Surface diffusion proceeds rather slowly and occurs at comparatively short length scales (for example, <1 μm) at Fab-compatible deposition temperatures (for example, ≤750° C.). The general lack of diffusional transport results in a high $MX_2$ nucleation density and the deposited $MX_2$ monolayer develops a nanocrystalline grain structure (for example, 10 nm to a few hundred of nm). Thus, MOCVD of $MX_2$ generally suffer from poor control over crystallinity and crystal grain size, hindering their electrical performance in semiconductor devices.

In light of the above, it is an objective to provide a method enabling Fab-compatible MOCVD of a transition metal dichalcogenide/$MX_2$ material with improved control over crystallinity and grain size. Further and alternative objectives may be understood from the following.

According to an aspect, there is provided a method of depositing a transition metal dichalcogenide, the method including: depositing a layer of the transition metal dichalcogenide on a substrate by a metalorganic chemical vapor deposition process including exposing the substrate to a mixture of reactant gases including a transition metal precursor and a chalcogen precursor, wherein the mixture further includes a gas-phase halogen-based reactant to volatilize transition metal adatoms deposited on the substrate.

The disclosed technology is based on the insight that exposing the substrate to transition metal and chalcogen precursors, and simultaneously to a gas-phase halogen-based reactant can cause halogenation and thus volatilization of transition metal adatoms (for example, transition metal atoms adsorbed to a surface of the substrate). The gas-phase halogen-based reactant may additionally cause halogenation of the (gas-phase) transition metal precursor. In certain implementations, this enhances the transition metal desorption rate and increases the occurrence of long-range diffusional transport and in turn contributes to reduced nucleation density on the substrate and growth of a larger (for example, micrometer-scale) mono- or polycrystalline $MX_2$ layer.

In various implementations, the gas-phase halogen-based reactant brings the further advantage of mitigating transition metal co-deposition on the substrate. It is envisaged that this is due to the halogen-based reactant halogenating the less thermally stable metal-organic transition metal precursor by a reaction in gas-phase.

In some embodiments, in the metalorganic chemical vapor deposition process, a deposition temperature and a halogen-based reactant concentration of the mixture are such that the desorption flux from the substrate exceeds the net condensation flux to the substrate. In other words, the layer of the $MX_2$ may occur under a condition of low supersaturation. This enables lateral gas-phase diffusion and results in reduced nucleation density, and the growth of micrometer-scale monocrystalline $MX_2$ layers.

A deposition temperature of the metalorganic chemical vapor deposition process may be 750° C. or lower. A temperature in this range makes the deposition process Fab-compatible and has been shown to provide favorable deposition conditions for the $MX_2$ layer, when combined with the addition of the gas-phase halogen-based reactant.

In some embodiments, the substrate may be arranged in a reactor and the gas-phase halogen-based reactant may be introduced into the reactor simultaneous to the transition metal precursor and chalcogen precursor. The simultaneous presence of the precursors and the halogen-based reactant enables the probability for transition metal adatom desorption to be increased appreciably. Introducing the halogen-based reactant together with the precursors (for example, all in gas-phase) facilitates handling and control of the reactant gas and contributes to the Fab-compatibility of the deposition method.

The gas-phase halogen-based reactant may be introduced into the reactor in an amount exceeding an amount of the transition metal precursor introduced into the reactor. This can facilitate achieving a desorption flux exceeding the net condensation flux.

In some embodiments, the gas-phase halogen-based reactant is HCl or $Cl_2$. These halogen-based reactants can enable chlorination of the transition metal, both of the transition metal adatoms and of the metalorganic transition metal precursors present in the mixture of reactant gases.

In some embodiments, the transition metal precursor may include a transition metal from any one of groups III to XII.

The transition metal precursor may, for example, include tungsten (W), molybdenum (Mo), zirconium (Zr), or hafnium (Hf).

The transition metal precursor may be a metalorganic molecule that exhibits appreciable vapor pressure at room temperature (for example, 0.01-0.10 Torr) to ease delivery into reaction chamber and mitigate precursor condensation. Such precursor species include carbonyls ($M\text{-}(CO)_x$), alkyls ($M\text{-}R_x$), alkoxides ($M\text{-}(OR)_x$). The transition metal precursor may, for example, be tungsten hexacarbonyl ($W(CO)_6$) or tungsten hexamethyl ($W(CH_3)_6$), or molybdenum hexacarbonyl ($Mo(CO)_6$), or hafnium and zirconium alkoxides such as tetrakis(1-methoxy-2-methyl-2-propoxy)hafnium ($Hf(mmp)_4$).

In some embodiments, the chalcogen precursor may include sulfur (S), selenium (Se), or tellurium (Te).

The chalcogen precursor may, for example, be hydrogen sulfide ($H_2S$), hydrogen selenide ($H_2Se$), or hydrogen telluride ($H_2Te$).

The method is compatible with various types of substrates:

In some embodiments, the layer of the transition metal dichalcogenide may be deposited on an amorphous or crystalline surface of the substrate.

The surface of the substrate may be a sapphire surface.

The surface of the substrate may alternatively be a surface of a scaled dielectric layer of the substrate. The term "scaled dielectric layer" as discussed herein may be understood to refer to a dielectric layer with a thickness of 10 nm or less, for example, in a range from 5 to 10 nm. As may be understood from the above, the addition of the halogen-based reactant can enable a deposition temperature in a range (for example, 750° C. or lower) which is compatible with scaled dielectric layers.

The dielectric layer may, for example, be a layer of $SiO_2$, $Al_2O_3$, $HfO_2$, $ZrO_2$, $Si_3N_4$, or SiCO.

BRIEF DESCRIPTION OF THE DRAWINGS

The above, as well as additional objects, features and advantages, may be better understood through the following illustrative and non-limiting detailed description, with reference to the appended drawings. In the drawings like reference numerals will be used for like elements unless stated otherwise.

FIGS. 1A, 1B, 1C, and 1D illustrate, as a comparative example, challenges with MOCVD of $MX_2$.

DETAILED DESCRIPTION OF CERTAIN ILLUSTRATIVE EMBODIMENTS

FIGS. 1A-1D illustrate as a comparative example, challenges with MOCVD of $MX_2$. FIGS. 1A-1D show images obtained using an atomic force microscope (AFM) of the result of a 10 minutes MOCVD process of $WS_2$ using the $W(CO)_6$ and $H_2S$ precursors at four different deposition temperatures 700° C., 800° C., 900° C. and 1000° C. respectively. The starting surface is in each example a 2000 nm $SiO_2$ (for example, grown by wet thermal oxidation of a Si wafer). In practice, only the deposition temperature of 700° C. may be considered Fab-compatible given the reactivity of precursors towards starting surface. However, this results in a very high nucleation density, which may be attributed to a low tungsten adatom desorption and diffusion length. Since surface diffusion is mainly temperature driven, higher deposition temperatures provide a reduced nucleation density and increased crystal size as may be seen in FIGS. 1A-1D. However, deposition temperatures of 800° C. further exhibit an increasing co-deposition of tungsten (seen as white dots).

Figure 2A:
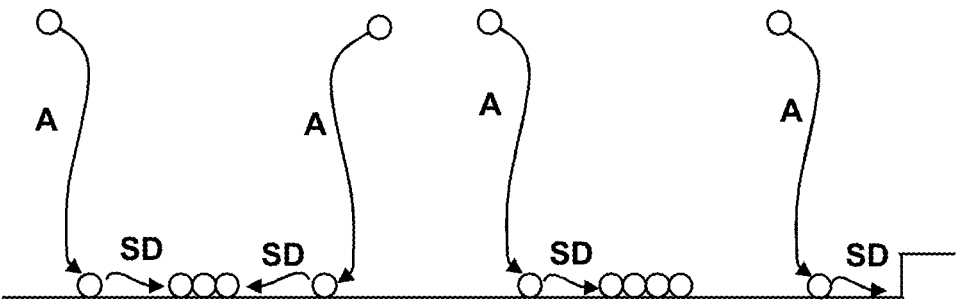
FIGS. 2A-2B and 3A-3B schematically illustrate deposition in a case of high and low supersaturation, respectively.
Figure 2B:
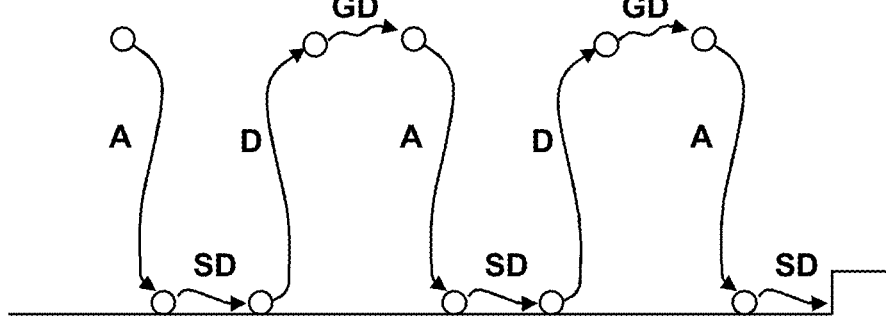
Figure 3A:
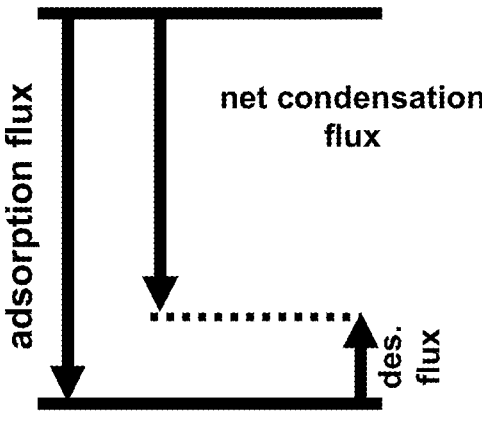
Figure 3B:
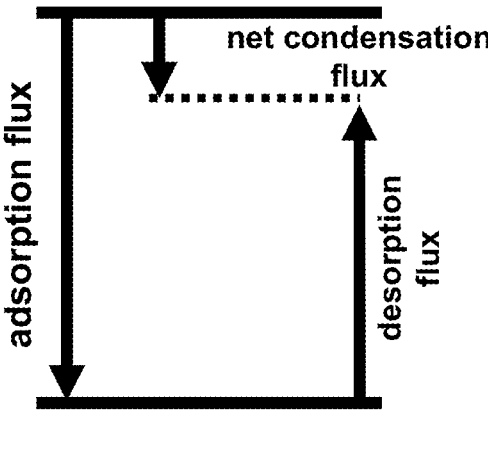

FIGS. 2A and 2B schematically illustrate deposition under a condition of high supersaturation and low supersaturation, respectively, for a transition metal precursor: "A" denotes adsorption to the substrate surface, "D" denotes desorption from the substrate surface, "SD" denotes surface diffusion, and "GD" denotes gas diffusion. It is envisaged that the process of "adsorption," as discussed herein, may be understood to refer to adsorption by physisorption, wherein the adatoms are bonded to the starting surface of the substrate by weak van der Waals forces. High supersaturation may refer to a desorption flux that is much lower than a net condensation flux to the substrate surface, as shown in FIG. 3A. High supersaturation corresponds to the comparative examples shown in FIGS. 1A-1D, wherein the adsorption is substantially irreversible and the transition metal adatoms are incorporated into the $MX_2$ crystal predominantly through surface diffusion. On the other hand, low supersaturation may refer to a desorption flux that is appreciably greater than a net condensation flux to the substrate surface, as shown in FIG. 3B. As may be seen in FIG. 3B, under low supersaturation, the adsorption and desorption fluxes may be substantially equal.

As set out herein, embodiments of the disclosed technology provide a method which enables deposition of $MX_2$ using MOCVD under a low supersaturation regime. More specifically, according to an aspect of the disclosed technology, there is provided a method of depositing a transition metal dichalcogenide (for example, $MX_2$ material). The method includes depositing a layer of $MX_2$ on a substrate by a MOCVD process including exposing the substrate to a mixture of reactant gases including a transition metal precursor (for example, a transition metal in a metalorganic precursor) and a chalcogen precursor. The mixture further includes a gas-phase halogen-based reactant to volatilize transition metal adatoms deposited on the substrate.

Figure 4:
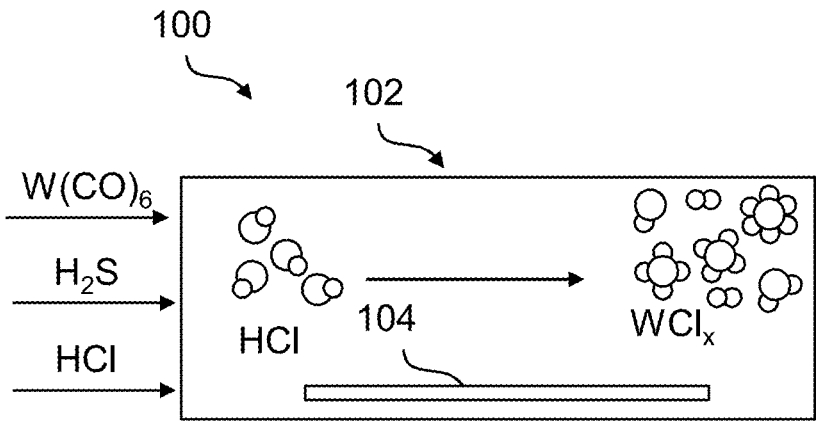
FIG. 4 schematically depicts a deposition method according to an embodiment.

FIG. 4 schematically depicts an embodiment of a method according to the present disclosure, wherein a substrate 104 is arranged in a reactor 102 of an MOCVD tool 100. The substrate 104 provides the starting surface for the $MX_2$ deposition and may be formed by a surface of an amorphous dielectric layer, for example, a scaled dielectric layer. The dielectric layer may for example be a layer of $SiO_2$, $Al_2O_3$, $HfO_2$, $ZrO_2$, $Si_3N_4$, or SiCO, for example, with a thickness in a range from 5-10 nm. However, the starting surface may also be formed by a sapphire substrate, or more generally, another suitable monocrystalline, polycrystalline or amorphous substrate.

As depicted in FIG. 4, the transition metal precursor (for example, $W(CO)_6$), the chalcogen precursor (for example, $H_2S$) and the halogen-based reactant (for example, HCl) are simultaneously introduced in gas-phase into the reactor 102 to form a mixture of reactant gases. The precursors and the reactant may be introduced in an inert carrier gas, such as argon (Ar), helium (He), or $N_2$. The substrate 104 may thus be simultaneously exposed to the constituent gases of the mixture. The substrate 104 may be heated (for example, by a heating element of a substrate holder, and/or by heating the atmosphere in the reactor) to provide a reaction condition enabling a gradual and sustained deposition of $MX_2$ on the starting surface of the substrate 102 for the duration of the MOCVD process (for example, on the order of a few minutes, depending on a desired size of the $MX_2$ layers). An example of an overall deposition reaction is $M(CO)_6+2$ $H_2S+HCl\text{->}MS_2+6$ $CO+2$ $H_2+HCl$ (for example, for excess of HCl), where M denotes the transition metal species.

In various implementations, the simultaneous presence of the precursors and the halogen-based reactant enables halogenation (for example, chlorination) of both transition metal adatoms (for example, W adsorbed to the substrate 102) and the transition metal precursor (for example, $W(CO)_6$). Thereby, the transition metal precursor may be volatilized to enable reversible precursor adsorption, and diffusion by lateral gas-phase transport may be enhanced (compare, for example, FIGS. 2B and 3B).

Figure 7:
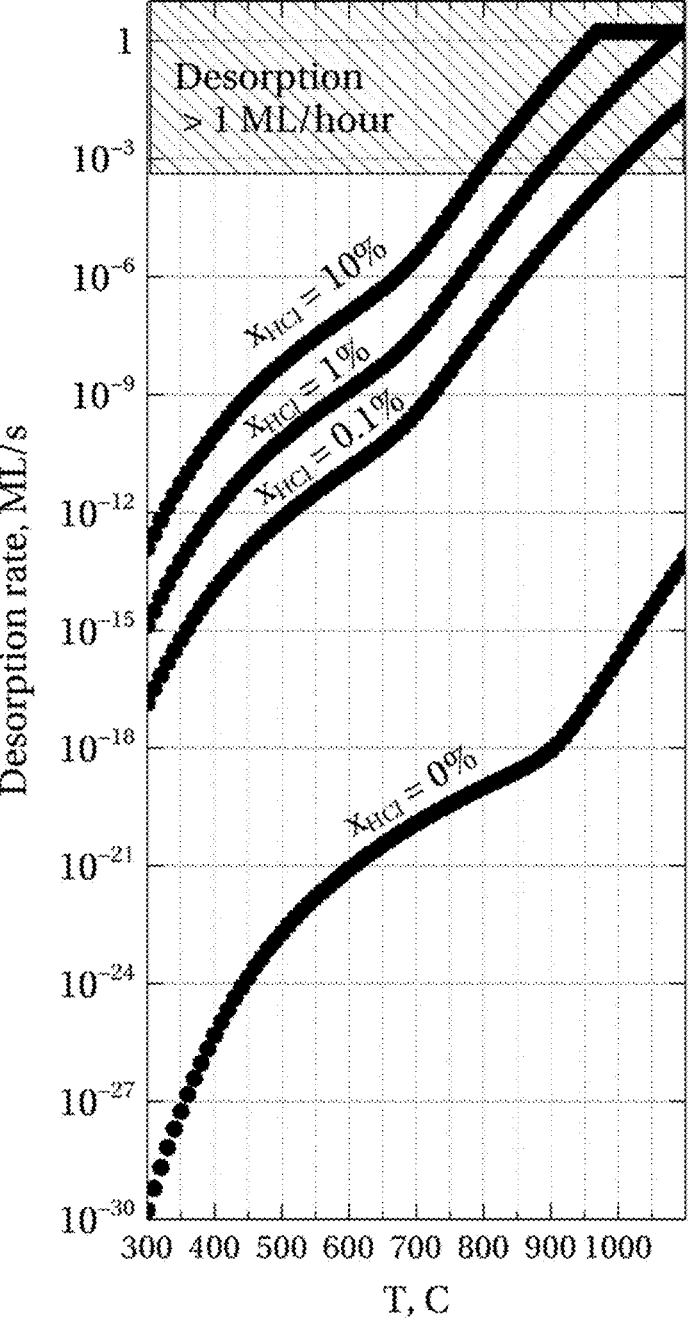
FIG. 7 shows metal precursor desorption rate as a function of deposition temperature for MOCVD of $WS_2$ with and without introduction of an HCl reagent.

FIG. 7 shows as an illustrative example respective simulated metal precursor desorption rates as a function of deposition temperature for MOCVD of $WS_2$ from $W(CO)_6$, and $H_2S$ for an HCl reagent concentration of 0%, 0.1%, 1% and 10%. As may be seen, HCl-assisted MOCVD considerably increases the desorption rate already at relatively minute amounts, and enables low supersaturation to be achieved during the deposition at Fab-compatible deposition temperatures, for example, below 750° C.

In addition to controlling the deposition temperature, the reaction conditions (and hence the nucleation density and net condensation) may be controlled by the relative concentrations of the transition metal precursor, the chalcogenide precursor and the halogen reactant (for example, by controlling the flow via respective inlet and outlet valves of the MOCVD tool). To facilitate achieving a condition of low supersaturation, the halogen-based reactant HCl may advantageously be introduced into the reactor 102 in an amount exceeding an amount of the transition metal precursor $W(CO)_6$.

While FIG. 4 shows a mixture of $W(CO)_6$, $H_2S$ and HCl, this is merely an example and other combinations of precursors and halogens are also possible, as discussed above.

Figure 5:
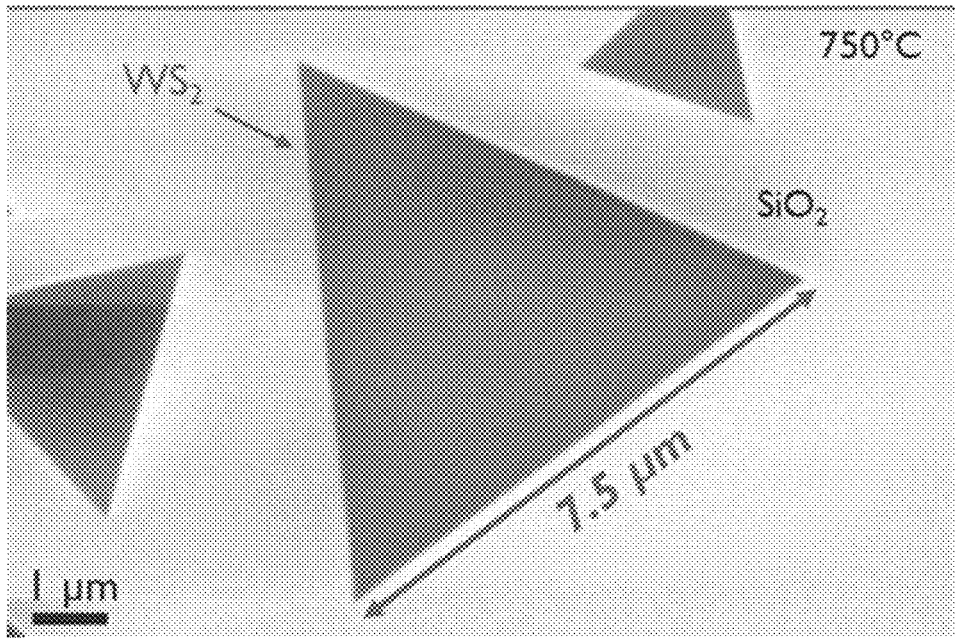
FIG. 5 shows the result of HCl-assisted MOCVD deposition of $WS_2$ according to an embodiment of the disclosed technology.

FIG. 5 is an SEM image of a micrometer-sized $WS_2$ crystal deposited on a $SiO_2$ starting surface using a method in accordance with the disclosed technology. The $WS_2$ was deposited in an MOCVD process using $W(CO)_6$ and $H_2S$ precursors and an HCl reactant. A concentration of $W(CO)_6$ was 0.3 ppm, while the flow of $H_2S$ was 20 sccm, and the flow of HCl was 1500 sccm for a total gas flow of 25000 sccm. A carrier gas of argon was used. The process was performed at a reactor pressure of 32 Torr and a deposition temperature of 750° C. This example demonstrates how the method of the disclosed technology can combine the ease of use of MOCVD precursors (for example, in terms of vapor pressure and precursor delivery) and volatility of halogens in a Fab-compatible deposition process.

Figures 6A, 6B, 6C, 6D:
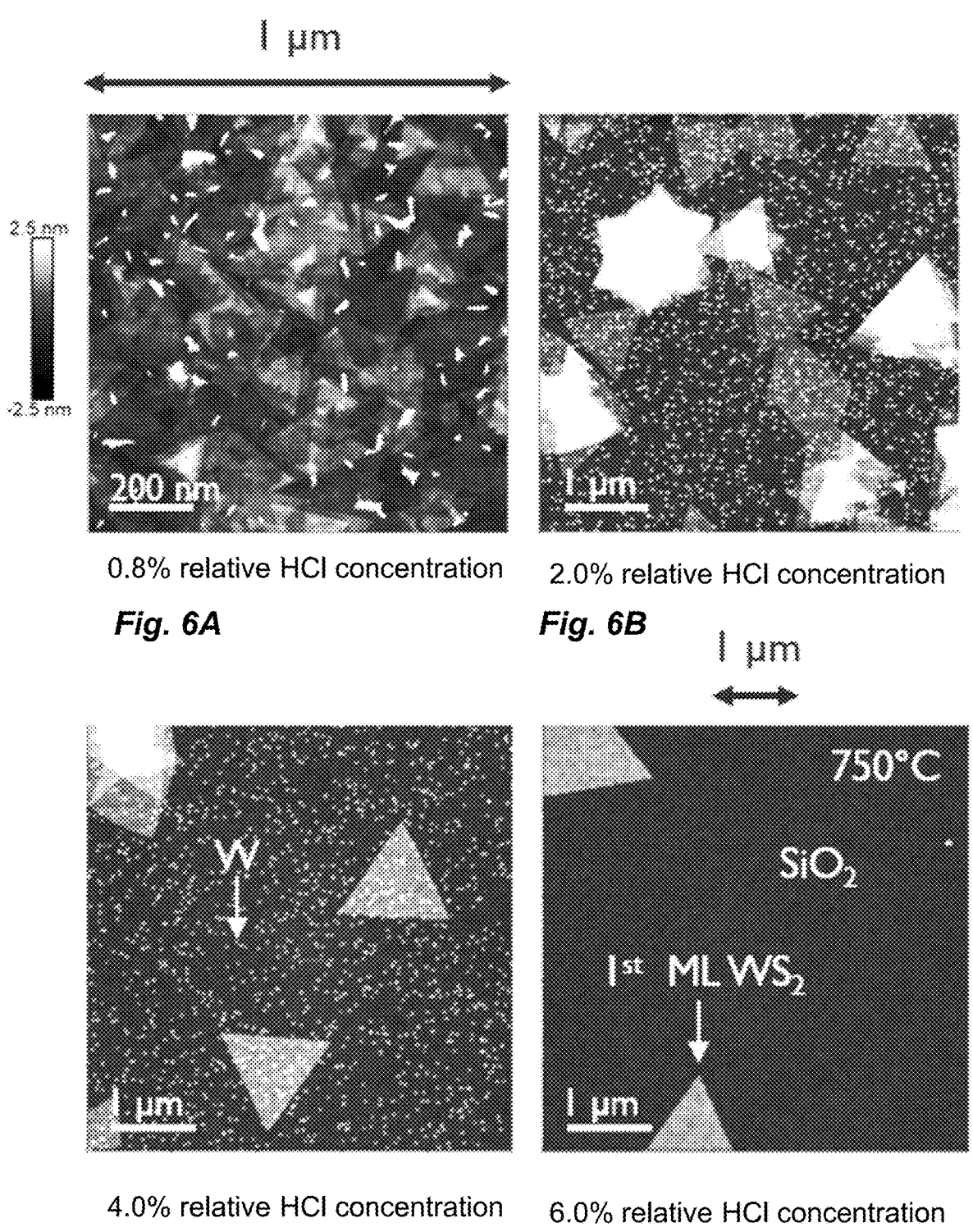
FIGS. 6A, 6B, 6C, and 6D depict an influence of relative HCl concentration on the MOCVD deposition of $WS_2$.

FIGS. 6A-6D show the influence of the relative concentration of HCl in the mixture of reactant gases for a fixed deposition temperature of 750° C. As the HCl concentration is increased, the nucleation density as well as transition metal co-deposition is suppressed. As seen in FIG. 6D, a relative HCl concentration of 6.0% allows the nucleation density to be reduced to less than 1 $\mu m^{-2}$, wherein growth of micrometer size $MX_2$ crystals without grain boundaries is facilitated.

In the above, the disclosed technology has mainly been described with reference to a limited number of examples. However, as is readily appreciated by a person skilled in the art, other examples than the ones disclosed above are equally possible within the scope of the disclosed technology.

What is claimed is:

1. A method of depositing a transition metal dichalcogenide, the method comprising:
   depositing a layer of the transition metal dichalcogenide on a substrate by a metalorganic chemical vapor deposition process comprising exposing the substrate to a mixture of reactant gases comprising a transition metal precursor and a chalcogen precursor,
   wherein the mixture further comprises a gas-phase halogen-based reactant to volatilize transition metal adatoms deposited on the substrate, and
   wherein in the metalorganic chemical vapor deposition process, a deposition temperature and a gas-phase halogen-based reactant concentration of the mixture are such that a desorption flux from the substrate exceeds a net condensation flux to the substrate.

2. The method according to claim 1, wherein a deposition temperature of the metalorganic chemical vapor deposition process is 750° C. or lower.

3. The method according to claim 1, wherein the substrate is arranged in a reactor and wherein the gas-phase halogen-based reactant is introduced into the reactor simultaneous to the transition metal precursor and chalcogen precursor.

4. The method according to claim 3, wherein the gas-phase halogen-based reactant is introduced into the reactor in an amount exceeding an amount of the transition metal precursor introduced into the reactor.

5. The method according to claim 1, wherein the gas-phase halogen-based reactant is HCl or $Cl_2$.

6. The method according to claim 1, wherein the transition metal precursor comprises W, Mo, Zr, or Hf.

7. The method according to claim 1, wherein the transition metal precursor is a carbonyl ($M\text{-}(CO)_x$), an alkyl ($M\text{-}R_x$), or an alkoxide ($M\text{-}(OR)_x$).

8. The method according to claim 1, wherein the chalcogen precursor comprises S, Se, or Te.

9. The method according to claim 1, wherein the chalcogen precursor is $H_2S$, $H_2Se$, or $H_2Te$.

10. The method according to claim 1, wherein the layer of the transition metal dichalcogenide is deposited on an amorphous or crystalline surface of the substrate.

11. The method according to claim 10, wherein the surface of the substrate is a sapphire surface.

12. The method according to claim 10, wherein the surface of the substrate is a surface of a scaled dielectric layer of the substrate.

13. The method according to claim 12, wherein the dielectric layer is a layer of $SiO_2$, $Al_2O_3$, $HfO_2$, $ZrO_2$, $Si_3N_4$, or SiCO.

14. The method according to claim 1, wherein the transition metal precursor comprises W, the chalcogen precursor comprises S, and the gas-phase halogen-based reactant is HCl.

15. The method according to claim 14, wherein the transition metal precursor is $W(CO)_6$ and the chalcogen precursor is $H_2S$.

16. The method according to claim 1, wherein a nucleation density is less than 1 $\mu m^{-2}$.

17. The method according to claim 16, wherein micrometer size transition metal dichalcogenide crystals without grain boundaries are grown.

\* \* \* \* \*